United States Patent
Slater et al.

(10) Patent No.: US 6,892,144 B2
(45) Date of Patent: May 10, 2005

(54) ARRANGEMENT FOR PROVIDING SENSOR CALIBRATION INFORMATION IN A MODULAR UTILITY METER

(75) Inventors: Byron J. Slater, Hermosa Beach, CA (US); John T. Voisine, Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 10 days.

(21) Appl. No.: 10/256,243

(22) Filed: Sep. 25, 2002

(65) Prior Publication Data

US 2003/0088374 A1 May 8, 2003

Related U.S. Application Data

(60) Provisional application No. 60/325,030, filed on Sep. 25, 2001.

(51) Int. Cl.$^7$ ............................ G01R 11/32; G01R 35/04
(52) U.S. Cl. ............................ 702/61; 324/74; 324/130
(58) Field of Search ...................... 702/61, 64, 79; 324/74, 130; 102/91, 90

(56) References Cited

U.S. PATENT DOCUMENTS

| | | | |
|---|---|---|---|
| 4,764,879 A | 8/1988 | Campbell | |
| 4,870,863 A | 10/1989 | Duncan et al. | |
| 4,963,820 A | 10/1990 | Medlin | |
| 5,089,979 A | 2/1992 | McEachern et al. | |
| 5,162,725 A | * 11/1992 | Hodson et al. | 324/115 |
| 5,249,143 A | * 9/1993 | Staley, III | 702/91 |
| 5,347,476 A | 9/1994 | McBean, Sr. | |
| 5,375,073 A | 12/1994 | McBean | |
| 5,377,128 A | * 12/1994 | McBean | 702/91 |
| 5,691,635 A | 11/1997 | Pot et al. | |
| 5,933,004 A | 8/1999 | Jackson et al. | |
| 6,112,158 A | 8/2000 | Bond et al. | |
| 6,112,159 A | 8/2000 | Bond et al. | |
| 6,377,037 B1 | 4/2002 | Burns et al. | |
| 6,629,046 B1 | * 9/2003 | Bond et al. | 702/61 |

OTHER PUBLICATIONS

"Alpha™ Solid State Polyphase Meter (Watts, Vars, VA)", AB Power T&D Company Inc., May 1992, (6 pages).

* cited by examiner

*Primary Examiner*—Marc S. Hoff
*Assistant Examiner*—Paul L Kim
(74) *Attorney, Agent, or Firm*—Maginot, Moore & Beck (57) ABSTRACT

A modular electronic utility meter has a sensor portion that includes sensor devices and a memory device storing calibration and/or error information specific to the sensor devices. Such a sensor portion is designed for use with a corresponding measurement portion that extracts the calibration and/or error information from the memory in the sensor portion. The measurement module then employs the calibration and/or error information in its calculation of energy consumption information. The calibration information includes phase and magnitude error information for at least one of a current sensing device and/or a voltage-sensing device. That error information may include coefficients of a polynomial.

20 Claims, 5 Drawing Sheets

ARRANGEMENT FOR PROVIDING SENSOR CALIBRATION INFORMATION IN A MODULAR UTILITY METER

This non-provisional U.S. patent application is based on and/or claims priority to provisional U.S. patent application No. 60/325,030 filed Sep. 25, 2001 entitled Arrangement For Providing Sensor Calibration Information In A Modular Utility Meter.

FIELD OF THE INVENTION

The present invention relates to utility meters and, in particular, modular electricity meters having a sensor portion and a removable measurement portion.

DESCRIPTION OF THE PRIOR ART

Utility meters such are commonplace with regard to measuring utility or commodity consumption or usage (e.g. electricity, gas, water, and the like) for billing the consumer. Such utility meters are interposed between the source of the utility and the usage point. The utility meters are generally located proximate the area of usage of the commodity and, in the case of electricity meters, are typically mounted on a side of the structure in which the electrical energy is consumed.

Electricity meters are devices that operate by obtaining voltage and current measurement signals from power lines and multiplying the voltage and current measurement signals to determine energy consumption. Historically, electricity meters employed rotating disks that rotated in response to electromagnetic forces derived from electricity flowing to the load through the meter. The speed of the rotation was proportional to the energy being consumed. Mechanical and/or electronic counters tracked the number of rotations so that overall energy consumption could be determined.

More recently, electricity meters that employ electronic measurement circuits have increasing been used. Electronic meters employ sensor devices that generate analog waveforms representative of the voltage and/or current on the power lines. The electronic meters further employs circuits that digitize the representative waveforms and calculate the energy consumption using digital processing methods. Such meters are known. The electronic meter thus may be divided into two basic components, a sensor portion and a processor-based measurement portion.

More specifically, the sensor portion is the portion of the watthour meter that attaches to the power lines. The sensor portion provides as an output both voltage and current measurement signals. The voltage measurement signals are representative of the voltage on the power line and the current measurement signals are representative of the current on the power line. The voltage and current measurement signals, or simply measurement signals, are provided to the measurement portion of the electronic watthour meter.

The measurement portion receives the measurement signals and typically digitizes the signals to produce digital current and voltage signals. The measurement portion then multiplies the digital current and voltage signals to generate energy consumption information that is thereafter displayed. The measurement portion may otherwise manipulate the digital current and voltage signals to generate other metering information, such as reactive or apparent energy consumption, peak demand periods and the like.

A modular electronic meter is an electronic meter in which the measurement portion may be physically disconnected from a corresponding sensor portion and be replaced with another measurement portion. Modularity is desirable because it allows upgrade of a meter in an installation without replacing the entire meter. Specifically, different measurement portions are designed to provide different features and services. To upgrade a modular meter, a measurement portion having one level of service may be replaced by another measurement portion having another level of service. Replacing only the measurement portion results in lower cost than replacing both portions.

A problem that arises in modular meters relates to calibration of the sensor devices in the sensor portion. In particular, the sensor devices used in the sensor portion of electronic meters often have unique response error. Typically, response error is most efficiently corrected in the measurement portion of the meter by inserting calibration values into the energy calculations. In non-modular meters, the existence of unique response error is typically not a problem because the measurement portion of each meter may be calibrated specifically to compensate for the unique response error of the sensor devices of the corresponding sensor portion.

However, such a calibration technique is more problematic with modular meters. In particular, the unique response error of the sensor circuitry requires that each new measurement module that is attached to a particular sensor circuitry must be re-calibrated to accommodate for the unique response error of the sensor circuitry. Such calibration requires measurement of the error under various circumstances and further requires programming of the calibration information into the measurement module. The error measurement is extremely difficult to achieve in a field-installed sensor portion.

A need therefore exists for a method of calibrating a modular meter such that a sensor portion with unique and specific response error may be mated with any measurement portion. Moreover, there is a need for such a method in which a measurement portion may be installed onto any of a plurality of sensor portions having unique and specific response errors.

SUMMARY OF THE INVENTION

The present invention fulfills the above needs, as well as others, by providing a sensor portion for a modular electronic meter that includes sensor devices and a memory device storing calibration information specific to the sensor devices. Such a sensor portion is designed for use with a corresponding measurement portion that extracts the calibration information from the memory in the sensor portion. The measurement module then employs the calibration information in its calculation of energy consumption information. The calibration information includes phase and magnitude error information for at least one of a current sensing device and/or a voltage sensing device. That error information may include coefficients of a polynomial.

In one form, the present invention is an electricity meter. The electricity meter includes a sensor module for connecting to the electrical system of a facility, and measurement module in communication with the sensor module. The sensor module has voltage and current sensors, and a memory device. The voltage and current sensors are operative to receive voltage and current signals from the electrical system. The sensor module is operative to generate measurement signals therefrom. The memory device stores sensor calibration data. The measurement module includes a measurement circuit operative to receive the measurement signals from the sensor module and the sensor calibration data from said memory device, and generate energy consumption data therefrom.

In another form, the present invention is an electricity meter. The electricity meter includes a sensor module for connecting to the electrical system of a facility, and a measurement module in communication with the sensor module. The sensor module has voltage and current sensors, and a memory device. The voltage and current sensors are operative to receive voltage and current signals from the electrical system. The sensor module is operative to generate measurement signals from the voltage and current signals. The memory device stores voltage sensor calibration data and current sensor calibration data. The measurement module includes a measurement circuit operative to receive the measurement signals from the sensor module, the voltage sensor calibration data, and the current sensor calibration data from the memory device and generate energy consumption data therefrom.

In yet another form, the present invention is a method of generating energy measurement signals in an electricity meter connectable to an electrical system of a facility, the electricity meter having a sensor module with a voltage sensor and a current sensor, and a measurement module with measurement circuitry. The method includes a) storing sensor calibration data for at least one of the current sensor and the voltage sensor in a memory device of the sensor module; b) obtaining by the sensor module energy measurement signals of the electrical system; c) providing the energy measurement signals and the sensor calibration data to the measurement module; and d) generating in the measurement module energy consumption data from the energy measurement signals and the sensor calibration data.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplifications set out herein are not to be construed as limiting the scope of the invention in any manner.

DETAILED DESCRIPTION OF THE INVENTION

Figure 1:
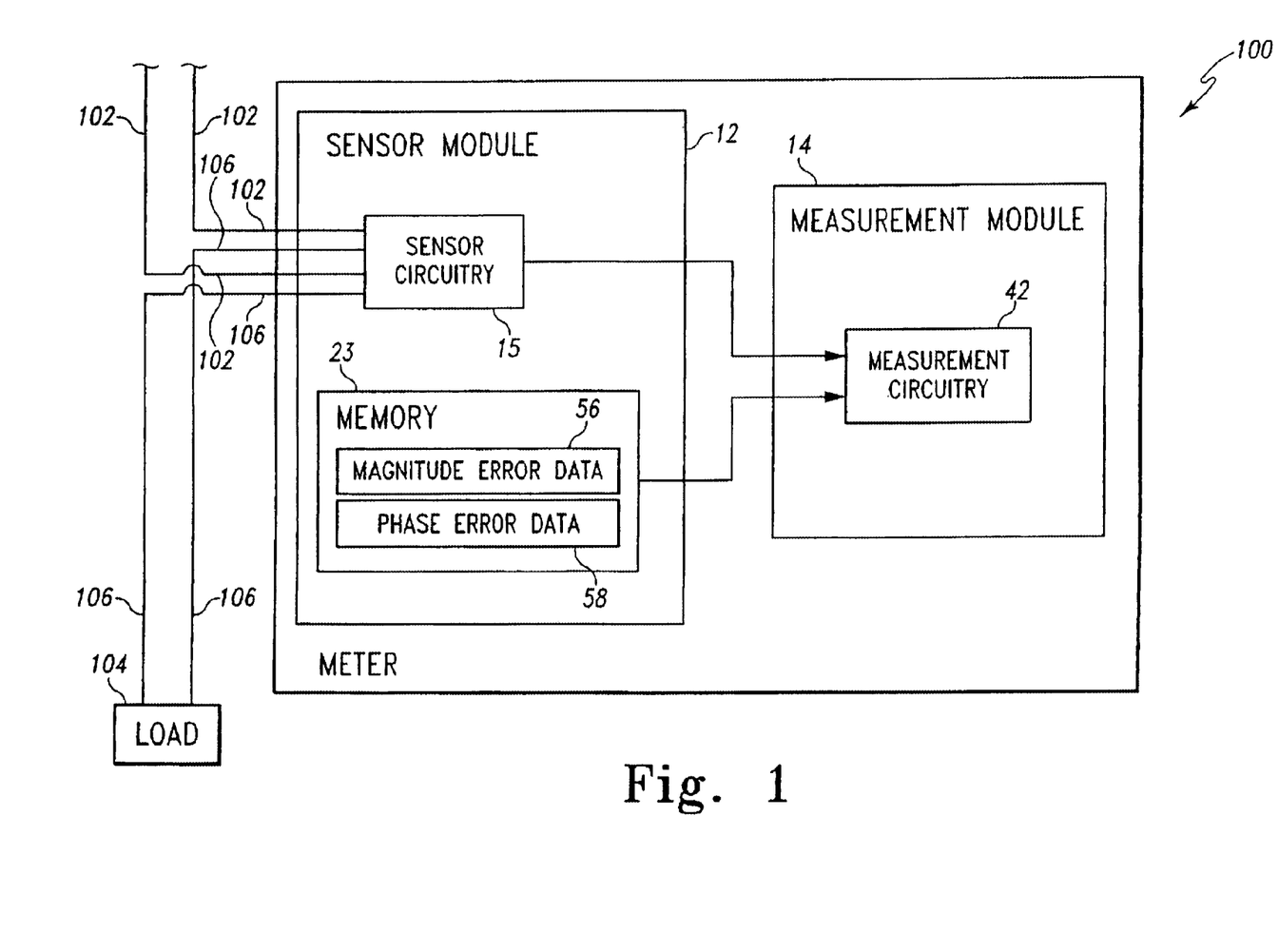
FIG. 1 shows a schematic block diagram of an exemplary embodiment of a utility meter according to the present invention.

Referring now to the drawings and, more particularly to FIG. 1, there is shown a diagram of an electrical utility meter, generally designated 100, constructed according to aspects of the subject invention. In FIG. 1, the meter 100 is operably coupled to utility power lines (facility lines) 102. The utility power lines 102 are connected to a source of electricity, such as a power transmission and distribution system, not shown. A load 104 (typically a consumer of electrical power) is connected to the power lines 102 through feeder lines 106. The meter 100 is operably coupled to the feeder lines 106 to detect the amount of electricity delivered to the load. The meter 100 is operative to, among other things such as those described herein, generate metering information representative of a quantity of electrical energy delivered to the load 104.

The meter 100 includes a sensor module 12 and a measurement module 14. The sensor module 12 includes sensor circuitry 15 interposed between the source of electricity (not shown) and the load 104 via the lines 102 and 106. The sensor circuitry 15 has one or more sensor components that may, and typically do, exhibit electricity measurement errors, for example phase error and magnitude error with respect to current and/or voltage. As such, the sensor components may introduce such error into the generated energy consumption data.

In accordance with an aspect and/or embodiment of the subject invention, the sensor module 12 further includes a memory device 23 that stores information relating to current and/or voltage measurement error exhibited by the sensor circuitry components. In particular, the memory device 23 stores calibration data for the sensor circuitry components in order for the measurement error exhibited by a sensor circuitry component (e.g. voltage and/or current sensors) to be adjusted when energy consumption data is generated by the measurement module 14. In one form, such calibration or error data is with regard to voltage and/or current magnitude error (component measurement error) and/or with regard to voltage and/or current phase (component measurement error). The memory device 23 may suitably be a ROM, PROM, EEPROM, or any other suitable memory. Preferably the memory device 23 includes a non-volatile memory in the sense that the memory device 23 does not require bias power to retain its contents.

In general, the sensor module 12 is operably coupled to the power lines to generate analog measurement signals representative of the voltage and current thereon. In an exemplary embodiment, the sensor module 12 may suitably comprise the sensor module of the meter described in U.S. Pat. No. 5,933,004, which is incorporated herein by reference. The sensor module 12 is further operable to provide the analog measurement signals to the measurement module 14.

The measurement module 14 includes processing and/or measurement circuitry 42 operative to determine metering information, for example, energy consumed, from the received measurement signals. In order to provide an adjustment or calibration for sensor circuitry/component electricity measurement error, the measurement module 14 obtains the error or calibration information from the memory device 23 and performs compensation or adjustment of the metering information based on that error or calibration information.

The sensor circuitry 15 of the sensor module 12 typically includes, among other components, current sensors that generate current measurement signals. Current sensors, which may take many forms as in known in the art, are subject to error that introduces a magnitude error component and/or a phase error component into the current measurement signal.

To compensate for such errors, adjustments may be made in the measurement module 14. In particular, the measurement module 14 may use scalar multiplier A to adjust the magnitude of the current measurement signal. For example, if the magnitude error in a particular current sensor is uniformly 5% low, then the measurement circuit may effect a calculation such that the current signal is multiplied by a scalar quantity of 1.05. The quantity 1.05 represents a scalar compensation factor that compensates for the 5% magnitude error of the current sensor. To perform the compensation, the measurement circuitry 42 of the measurement module 14 may include digital circuitry, for example, a processing device, that is operable to perform such a multiplication.

Phase error may be compensated in many ways by the measurement circuitry 42 in the measurement module 14. In a preferred embodiment, the phase error is compensated by introducing a delay that corresponds to the phase error. It is noted that phase error is relevant because it can adversely affect the accuracy of a power measurement. For example, if a 120 volt rms line carries a current of 2 amps rms that is 45° out of phase with the voltage, then the actual power consumption is Vrrns*Irms*Cos(θ), which is 240*Cos(45°) or 169.7 watts. If, however, the current sensor introduces a +5° phase error, then the measured power consumption would be 240*Cos(50°) or 154.3 watts. Such an error is significant in metering.

The effect of phase error is more pronounced when the phase difference between voltage and current is approximately 60°. For example, if the 120 volt line carries a current of 2 amps, and the current and voltage are out of phase by 60°, then the actual power consumption is 120 watts. However, with the 5° phase error, the measured power consumption would be 101 watts. Accordingly, phase error can result in significant power measurement error. In most cases, the phase error introduced by the sensor circuitry is much smaller. However, due to the high level of accuracy required in electricity meters, even small power measurement errors due to small phase errors can be unacceptable.

Compensation for phase errors may occur using time delay. Because electrical power is typically provided at a relatively constant frequency, for example, 60 Hz in the United States, a phase error introduce by the current measurement device may be expressed as a time delay. Time delay may be expressed as Phase Error/(360)(60) seconds. For example, a 0.5° phase error is equal to a time delay of 0.5/(360)(60) or 23.1 microseconds.

To counteract the effect of the time delay introduced by the current sensor, it is possible to introduce a similar delay B into the voltage measurement signal such that the voltage and current will be similarly delayed, but accurate with respect to each other. Because the voltage and current would have the correct phase relationship with each other, subsequent measurements should not be affected by the current sensor phase error.

The delay may suitably be introduced by a discrete digital element through which the voltage measurement signal (in digital form) passes. Alternatively, the delay may be introduced within a digital signal processor or the like. One example of an electricity meter measurement circuit that can compensate for phase delay is shown in U.S. Pat. No. 6,377,037 which is incorporated herein by reference.

Accordingly, once phase and/or magnitude errors of a sensor device are known, the meter measurement module 14 may compensate for such error by employing a scalar value A to compensate for magnitude error and/or a time delay value B to compensate for phase error. It should be noted that the above applies equally with respect to the voltage sensors 114 of the sensor circuitry 15.

In accordance with the present invention, values from which A and B may be derived are determined for a particular one and/or set of sensors and then stored in the memory 23 (storage device) on the sensor module 12. Thus, when the measurement module 14 is attached thereto, the measurement module 14 reads the stored phase and/or magnitude error information and determines the A and B values therefrom. Typically, a separate set of phase and magnitude error information is stored for each current sensor and/or voltage sensor in the sensor module 12. The measurement module 14 therafter applies compensations using the A and B values.

The error or calibration information or data in the memory 23 may actually constitute the A scalar value and the B time delay value if the error for the current and/or voltage sensors is typically constant, or at least if an approximation of the error at a constant level is sufficient. Alternatively, however, the stored values may be coefficients of a polynomial equation, where A and/or B represent coefficient vectors of the polynomials. Such polynomials are advantageous because it has been observed that the magnitude and/or phase error of certain current sensors can vary as a function of current, while the magnitude and/or phase error of certain voltage sensors can vary as a function of voltage.

For example, if instead of using the equation I_adj= A*I_m as the magnitude error compensation, where I_adj is the compensated current measurement and I_m is the measured current, the measurement circuitry 42 may employ $I\_adj = A_0 + A_1(I\_m) + A_2(I\_m)^2 + A_3(I\_m)^3$, or a longer polynomial. The memory 23 in the sensor module 12 would then store the values representative of $A_0$, $A_1$, $A_2$, and $A_3$.

Similarly, instead of using the equation Delay=B as the phase error compensation, wherein Delay is the value of the delay expressed in terms useful to the processing circuitry, the measurement circuitry 42 may employ Delay=$B_0+B_1(I\_m)+B_2(I\_M)^2+B_3(I\_m)^3$, or a longer polynomial. The memory 23 in the sensor module 12 would then store values representative of $B_0$, $B_1$, $B_2$, and $B_3$.

In this manner, the correction for error can have a higher accuracy. Development of the coefficients may be achieved by performing several measurements through the current and/or voltage sensors at different known load currents and/or voltages and plotting the error. An example of how current sensor phase and magnitude errors may be determined is discussed in U.S. Provisional Patent Application No. 60/325,075, entitled "Self-Calibrating Electricity Meter," filed Sep. 25, 2001, which is incorporated herein by reference. Although the self-calibration aspects of such Patent Application are not necessary, the general types of measurements performed to determine the sensor magnitude and phase error may be adapted for use in connection with the present invention.

Once the phase and magnitude errors are plotted for various load current and/or voltage levels, the polynomial curve may be fitted to the plotted error points. Alternatively, such coefficients may be derivable from tolerance information provided by the sensor manufacturer.

Figure 2:
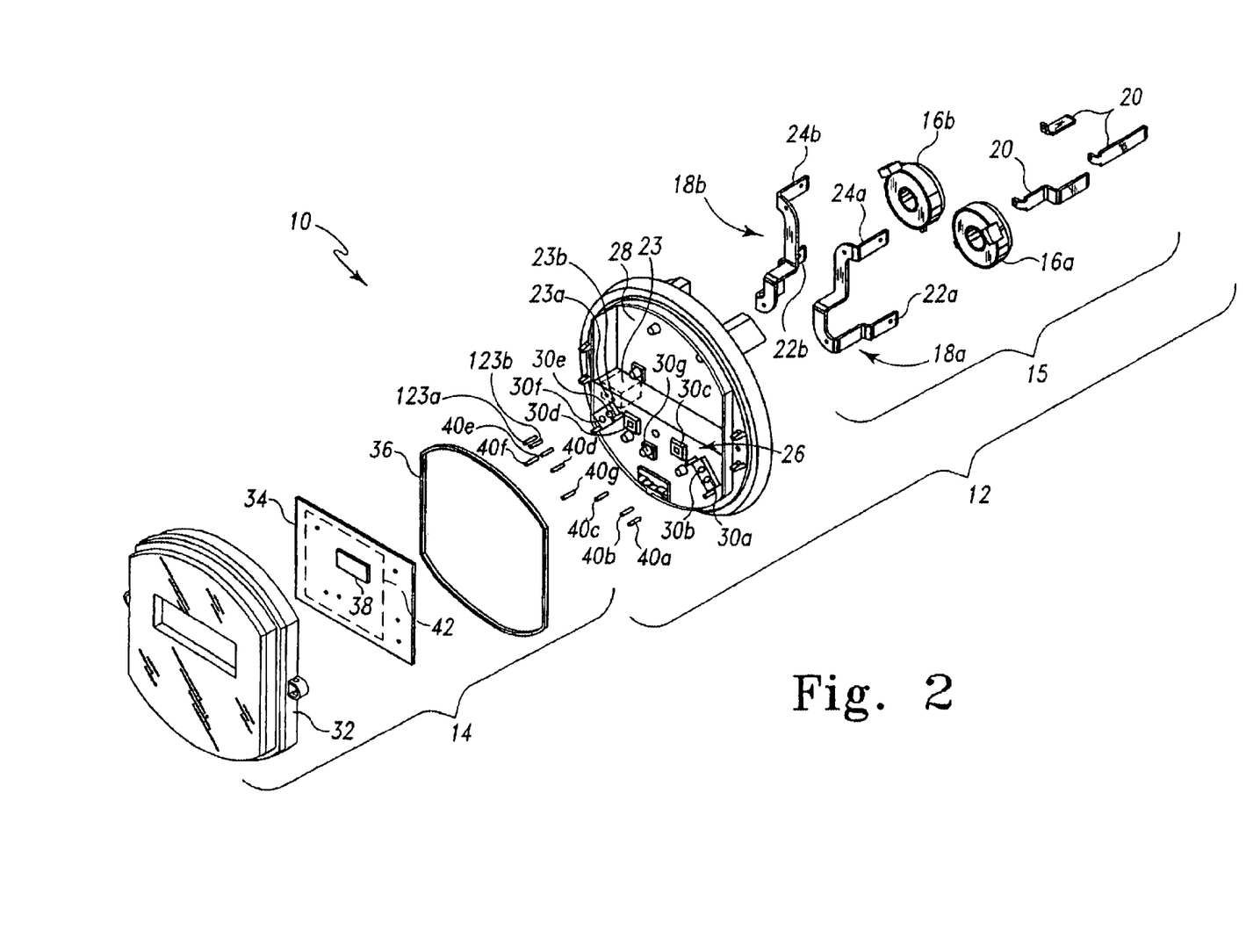
FIG. 2 shows an exploded assembly view of an exemplary embodiment of the meter of FIG. 1.

With reference now to FIG. 2, there is depicted an exploded view of the modular utility meter 10 according to the present invention. The utility meter 10 depicts the sensor module 12 and the measurement module 14. The utility meter 10 is constructed as described below such that the measurement module 14 is removable from the sensor module 12. The exemplary utility meter 10 is a type of meter known in the utility or revenue metering industry as a 12S meter form. The meter form relates to the application of the meter installation, for example whether it is single phase or polyphase. In any event, it will be noted that the present invention is not limited to application involving 12S meter forms, but may readily be incorporated into 2S, 8S/9S and other well known meter forms by those of ordinary skill in the art.

The sensor module 12 includes voltage and current sensing means 15, which according to the exemplary embodiment described herein, includes first and second current transformers 16a and 16b, respectively, first and second current coils 18a and 18b, respectively, and one or more neutral blades 20. In general, the first and second transformers 16a and 16b, respectively, constitute the current sensors and direct connections to the first and second current coils 18a and 18b, respectively, constitute the voltage sensors. In accordance with one aspect of the present invention, the sensor module 12 further includes a memory device 23.

The first current coil 18a includes first and second ends defining first and second current blades 22a and 24a, respectively, to be received by the jaws of a compatible meter socket. The second current coil 18b likewise includes first and second ends defining first and second current blades 22n and 24b, respectively, to be received by the jaws of a compatible meter socket.

The first and second current transformers 16a and 16b, respectively, are preferably toroidal transformers having a substantially circular shape defined by a circular core. In the present embodiment, the first current transformer 16a has a turns ration of N1 and the second current transformer has a turns ratio of N2. Using such toroidal current transformers, the first current coil 18a, when assembled, passes through the interior of the toroid of the first current transformer 16a. Preferably, the current transformer 16a is arranged such that the axial dimension of the current transformer 16a is arranged such that the axial dimension of the current transformer 16a is substantially parallel to the axial dimension of the sensor module 12. In other words, the current transformer 16a is horizontally disposed within the sensor module 12. The second current transformer 16b and the second current coil 18b are preferably arranged in a similar manner within the sensor module 12. Accordingly, the second current transformer 16b is also horizontally disposed within the sensor module 12. The use of horizontally disposed toroidal current transformers reduces the thickness and thus reduces the overall bulk of the meter 10.

The sensor module 12 further includes an electrically safe interface 26. The electrically safe interface 26 shields human users from potentially hazardous signals when the sensor module 12 is coupled to the electrical power lines and no measurement module is attached. Further detail regarding the electrically safe interface 26 may be found in U.S. Pat. No. 5,933,004.

In the present embodiment, the electrically safe interface 26 includes a top plate 28, and a plurality of sockets 23a, 23b, 30a, 30b, 30c, 30d, 30e, 30f and 30g. Each of the sockets 23a, 23b, 30a, 30b, 30c, 30d, 30e, 30f and 30g defines an opening in the top plate 28. Other than the openings defined by the sockets 23a, 23b, 30a, 30b, 30c, 30d, 30e, 30f and 30g, the top plate 28 preferably forms a complete barrier or wall from the measurement module 14 to the voltage and current sensing means 15.

Alternatively, at a minimum, the top plate 28 operates to prevent human contact with the portions of the voltage and current sensing means 15 that directly contact the power lines of the facility and, in particular, the current coils 18a and 18b.

The sockets 23a, 23b, 30a, 30b, 30c, 30d, 30e, 30f and 30g and their corresponding openings are preferably configured to prevent a human operator from physically contacting the electrically conductive portions of the socket. In particular, the openings defined by the sockets 23a, 23b, 30a, 30b, 30c, 30d, 30e, 30f and 30g have sufficiently diminutive proportions to prevent contact of a standard test finger with the electrically conductive portions of the sockets 23a, 23b, 30a, 30b, 30c, 30d, 30e, 30f and 30g. A standard test finger is a mechanical device used in the electrical industry to determine whether an electrical connection socket is safe from accidental contact by a human finger. One standard test finger is described in Underwriter's Laboratory, Inc., Standard For Safety of Information Technology Equipment Including Electrical Equipment Business UL-1950 (Feb. 26, 1993).

The measurement module 14 comprises a face cover 32, a printed circuit board 34, and a gasket 36. The printed circuit board 34 includes a display 38, and a measurement circuit, discussed further below, shows a schematic diagram of a measurement circuit 42 that may readily be used as the measurement circuit on the printed circuit board 34. The measurement circuit 42 is operative to receive measurement signals and generate data therefrom as described in detail below. The measurement circuit 42 is operably connected to provide at least some of the data to the display 38.

The measurement module 14 further includes a second interconnecting means operative to cooperate with the first interconnecting means (on the sensor module 12) to connect the measurement circuit 42 of the printed circuit board 34 to the voltage and current sensing means 15. For example, in the present embodiment, the measurement module 14 includes a plurality of plugs 123a, 123b, 40a, 40b, 40c, 40d, 40e, 40f and 40g, when assembled, are electrically connected to the measurement circuit and physically connected to the printed circuit board 34.

Figure 3:
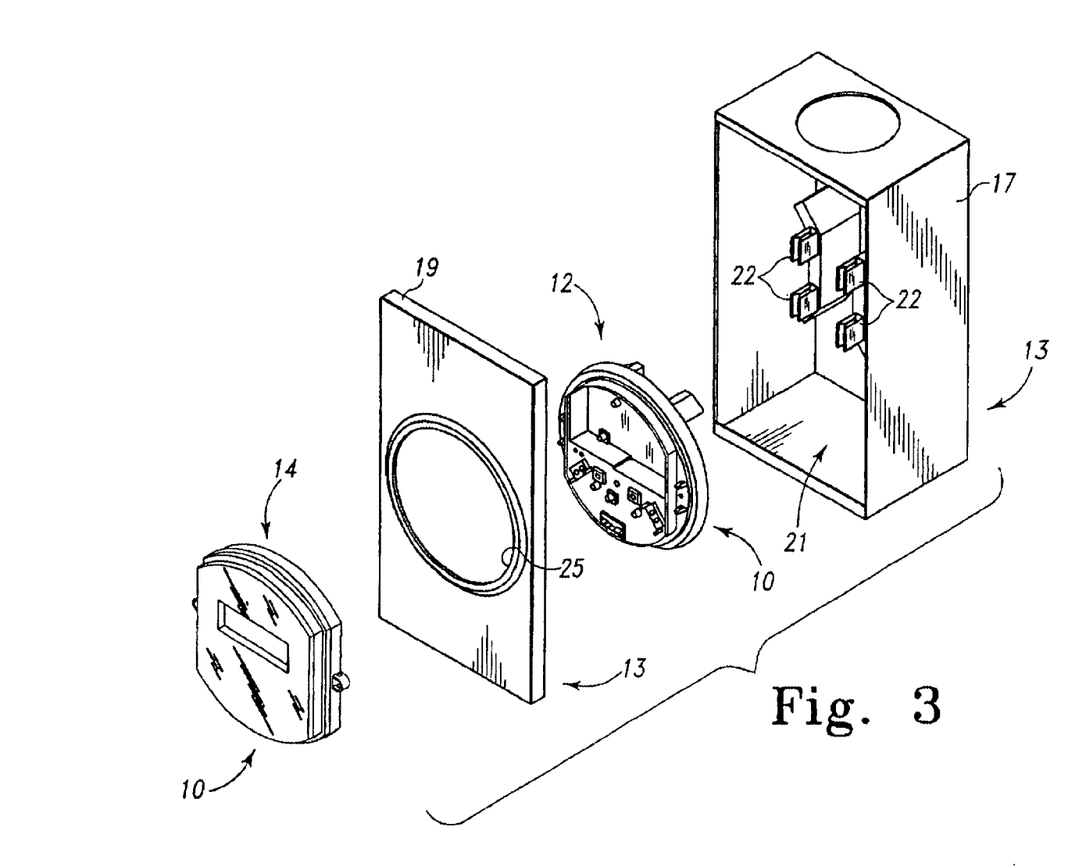
FIG. 3 shows an installation configuration that includes the meter of FIG. 2, and a meter box comprising a housing and a cover.

FIG. 3 shows an installation configuration that includes the meter 10 and a meter box 13 comprising a housing 17 and a cover 19. The housing 17 is box-like in structure having an opening for receiving the power lines of the electrical system being metered, not shown. It will be appreciated that the housing 17 need not be box-like in structure, and that any other suitable shape may be used, as long as there is an opening for receiving a cooperating meter box cover and a cabling opening. The housing 17 further includes an interior 21. Within the interior 21 are located a plurality of jaws 22 constructed of electrically conductive material. When installed into a facility, not shown, the plurality of jaws 22 are electrically connected to the power lines of the electrical system of the facility.

The plurality of jaws 22 receives and provides electrical connection to the current coil blades 22a, 24a, 22b and 24b as well as the neutral blade or blades 20. The relationship of the jaws 22 and the blades 22a, 24a, 22b and 24b also define the alignment of the sensor module 12 within the housing 17. Once the blades 22a, 24a, 22b and 24b are engaged with the plurality of jaws 22, then the sensor module 12 is installed within the interior 21 of the housing 17. The cover 19 is then installed onto the housing 17. The cover 19 includes a meter opening 25 having a perimeter defined by the perimeter of the sensor module 12. Preferably, the perimeter of the meter opening 25 has substantially the same shape and is slightly smaller than the perimeter of the sensor module 12 such that the sensor module 12 cannot be removed when the cover 19 is engaged with the housing 17.

Once the cover 19 is installed, the measurement module 14 in the present embodiment is placed in engagement with the sensor module 12 through the meter opening 25 of the meter box cover 19. When in engagement, the plugs 40a through 40g of the measurement module 14 are electrically connected to the sockets 30a through 30g, respectively, of the sensor module 12. Once the measurement module 14, cover 19, sensor module 12 and the housing 17 are all assembled as described above, the meter 10 (i.e. the sensor module 12 and the measurement module 14) performs energy consumption measurements, collects data, and performs other functions as described herein on the electrical system of the facility.

The configuration of the meter box 13 in FIG. 3 is a standard mounting device known as a ringless type mounting device. It will be noted that the meter 10 may readily be adapted for use in a ring-type mounting device. A ring type mounting device differs from the meter box 13 in FIG. 3 in that the sensor module 12 would be installed after the meter box cover 19 is assembled onto the housing 17. An annular ring would then be used to secure the sensor module 12 to the meter box cover 19. To this end, the standard meter box cover for use in a ring type mounting device includes a feature annularly disposed around the opening 25 that cooperates with the annular ring to engage and secure the sensor module 12 thereto.

Figure 4:
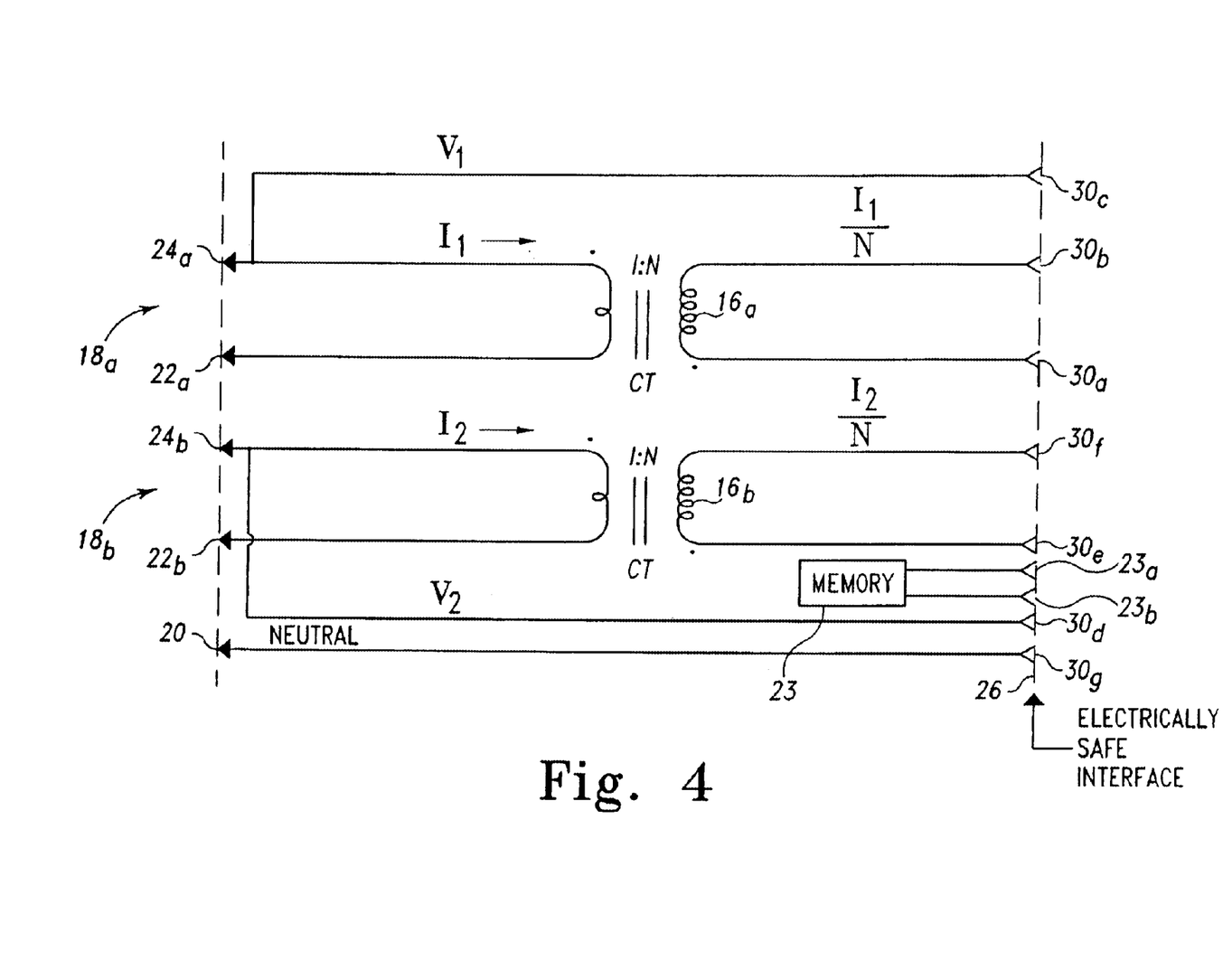
FIG. 4 shows an exemplary schematic circuit diagram of the sensor module of the meter of FIG. 2.

FIG. 4 shows a schematic circuit diagram of the sensor module 12. According to the present embodiment, the sockets 30a and 30b provide a connection to the first current transformer 16a, the sockets 30e and 30f provide a connection to the second current transformer 16b, the socket 30c provides a connection to the first current coil 18a, the socket 30d provides a connection to the second current coil 18b, and the socket 30g provides a connection to one or more of the neutral blades 20. The first current transformer 16a is in a current sensing relationship with the first current coil 18a, and the second current transformer 16b is in a current sensing relationship with the second current coil 18b. The sockets 23a and 23b provide a connection to the memory device 23.

Figure 5:
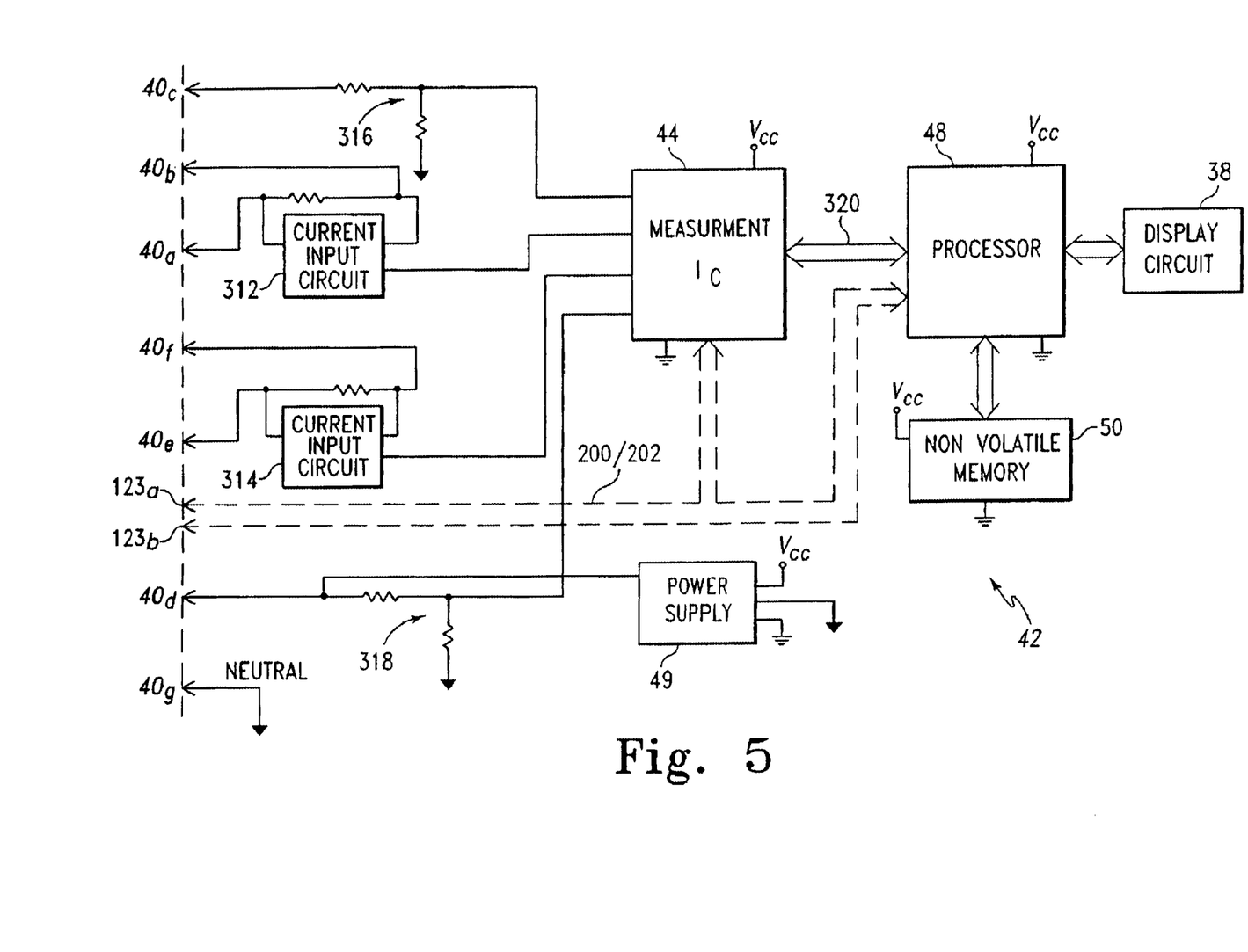
FIG. 5 shows an exemplary schematic block diagram of the measurement module of the meter of FIG. 2.

FIG. 5 shows a block diagram of an exemplary measurement circuit 42 and associated display 38 for use in the measurement module 14. The measurement circuit 42 includes a measurement integrated circuit (IC) 44, a controller or processor 48, memory 50, and a power supply 49. The memory 50 is preferably non-volatile memory. Plugs 40a, 40b, 40c, 40d, 40e and 40f are each connected to the measurement IC 44 through various input circuits. In particular, the plugs 40a and 40b are connected to the measurement IC 44 through a current input circuit 312, the plugs 40e and 40f are connected to the measurement IC 44 through a current input circuit 314, the plug 40c is connected to the measurement IC 44 through a current input circuit 316, and the plug 40d is connected to the measurement IC 44 through a voltage input circuit 318.

The current input circuit 312 is a device configured to obtain a scaled signal indicative of the line current waveform on the first feeder line. To this end, the current input circuit 312 is connected across a line resistor that is series connected between the plug 40a and the plug 40b. Plugs 40a and 40b, as discussed above and shown in the figures, are electrically connected to the first current transformer 16a of the sensor module 12. Similarly, the current input circuit 314 is a device configured to obtain a scaled signal indicative of the line current waveform on the second feeder line. To this end, the current input circuit 314 is connected across a line resistor that is series connected between the plug 40e and the plug 40f. Plugs 40e and 40f, analogous to plugs 40a and 40b, are electrically connected to the second current transformer 16b of the sensor module 12. The output of the current input circuits 312 and 314 are provided to the measurement IC 44.

The voltage input circuit 316 is a voltage divider network tapped off of the connection to plug 40c. Similarly, the input circuit 318 is a voltage divider network tapped off of the connection to the plug 40d. The power supply 49 is a device that receives AC input line voltage and generates a DC supply voltage Vcc therefrom. Such power supplies are well known in the art. The power input to the power supply 49 is preferably tapped off of the connection to the plug 40d. The outputs of the voltage input circuits 316 and 318 are provided to the measurement IC 44.

The measurement IC 44 is a device that receives measurement signals of the voltage and current signals including the phase and magnitude error signals and generates energy consumption data therefrom. In the exemplary embodiment described herein, the measurement IC 44 may suitably be the conversion circuit 106 described in U.S. Pat. No. 6,112,158 or the conversion circuit 106 described in U.S. Pat. No. 6,112,159, both of which are incorporated herein by reference.

Alternatively, the measurement IC 44 may be replaced by one or more discrete circuits capable of carrying out the same function of receiving the electricity (voltage and current) and error data/measurement signals and generating energy consumption information. For example the measurement IC 44 may suitably be replaced by the first and second watt measurement ICs 44 and 46 described in U.S. Pat. No. 5,933,004, which is incorporated herein by reference.

In any event, the measurement IC 44 is operably coupled to the memory 23 of the sensor module 12 and/or the sensor circuitry 15 of the sensor module 12 via lines 200 and 202 respectively. In particular, the lines 200 and 202 terminate in plugs 123a and 123b, respectively, which are in turn configured to couple to sockets 23a and 23b of the sensor module 23. Alternatively, a bus structure may be used to connect the measurement IC 44 to the memory device 23 via a connector between the sensor module 12 and the measurement module 14.

In the exemplary embodiment described herein, the measurement IC 44 receives the calibration data from the memory 23 through the lines 200 and 202. The measurement IC 44 may then utilize the magnitude error data and the phase error data as discussed herein. In an alternative embodiment, the lines 200 and 202 may be connected to provide the calibration data from the memory 23 of the sensor module 12 to the processor 48 of the measurement module 14. The processor 48 would then provide the calibration data to the measurement IC 44.

In either event, the measurement IC 44 is further operably connected to the processor 48 through a bus structure 320. The bus structure 320 consists of one or more serial and/or parallel busses that allow for data communication between the processor 48 and the measurement IC 44. In general, the measurement IC 44 provides energy consumption data to the processor 48. The processor 48 is operable to further process the data, store the data in memory 50, cause the data to be displayed or cause the data to be communicated, or a combination of any or all of these tasks. To this end, the processor 48 is further operably connected to the memory 50 and the display circuit 38.

In operation of the meter 10, energy consumption measurements are carried out in the following manner. As discussed above, the present embodiment is intended for use with a wiring configuration commonly referred to in the industry as a single-phase three-wire configuration. A single-phase three-wire configuration, as discussed above, typically includes a 240 volt line that is bisected into two 120 volt lines for use by the load, referred to herein as the First line and the Second line. The present invention, however, is in no way limited to use in single-phase configurations. These concepts can be employed in meters of other configurations, such as polyphase configurations.

In operation, the plurality of jaws 22 provide the first bisected power line or First line signal across the blades 22a and 24a. Similarly, the plurality of jaws 22 provide the second bisected power line or Second line signal across the blades 22b and 24b. The current blade 22a, which passes through the current transformer 16a, imposes a scaled version of the current, referred to herein as the first current measurement signal, on the first current transformer 16a. The first current measurement signal is approximately equal to the current flowing through the current blade 22a scaled by a factor of N1, where N1 is the turns ratio of the current transformer 16a. The first current measurement signal is provided to the sockets 30a and 30b. The first contact blade 24a further provides the first voltage measurement signal (i.e. the actual voltage of the First line) to the socket 30c.

Similar to the First line current, the Second line current flows from the blade 24b to the current blade 22b. The current blade 22b, which passes through the second current transformer 16b, imposes a scaled version of the Second line current onto the second current transformer 16b, thereby causing the second current transformer 16b to generate a second current measurement signal. The second current measurement signal is approximately equal to the Second line current scaled by a factor of N2, where N2 is the turns ratio of the second current transformer 16b. The turn ratios N1 and N2 of the current transformers 16a and 16b, respectively, are typically substantially similar and preferably equal. However, manufacturing tolerances may result in slight differences in the turn rations N1 and N2. In any event, the second current transformer 16b provides the second current measurement signal to the sockets 30e and 30f. The blade 24b also provides the second voltage measurement signal (i.e. the actual voltage line signal) to the socket 30d. The neutral blade 20 provides a connection between the neutral power line and the socket 30g.

It is noted that in the embodiment described herein, each of the current transformers 16a and 16b introduce a magnitude and a phase error in their respective current measurement signals. Such error typically arises as a phenomenon of the sensor technology. As discussed above in connection with FIG. 1, such errors can greatly reduce the accuracy of the metering process. However, the memory device 23 is preprogrammed with the phase error data and the magnitude error data specific to each of the transformers 16a and 16b as described above in connection with FIG. 1. Such data will be employed by the measurement IC 44 to compensate (i.e. correct for) the errors introduced into the current measurement signals.

Continuing with the general operation of the meter 10, the sockets 30a and 30b provide the first current measurement signal to the plugs 40a and 40b, respectively, of the measurement module 14. Likewise, the sockets 30e and 30f provide the second current measurement signal to the plugs 40e and 40f, respectively, of the measurement module 14. The sockets 30c and 30d provide, respectively, the first and second voltage measurement signals to the plugs 40c and 40d. The neutral socket 30g provides a neutral connection to the plug 40g.

The basic metering function provided by the measurement circuit 42 typically includes registration of accumulated energy usage, or some other measure of energy usage that may be tracked or billed. For example, the measurement circuit 42 may suitably maintain a register value from which a meter reader may determine the number of kilowatt-hours used. The measurement circuit 42 may also provide one or more advanced features typically associated with electricity meters, such as time of use metering, load profiling, demand metering, as well as other functions such as service type recognition, diagnostics, remote meter reading communications, or the like.

In any event, the plugs 40*a* and 40*b* provide the first current measurement signal to the measurement IC 44 through the current input circuit 312. The current input circuit 312 preferably converts the first current measurement signal to a voltage signal having a magnitude and phase that is representative of the First line current. The socket 40*c* provides the first voltage measurement signal through the voltage input circuit 316 to the measurement IC 44.

The plugs 40*e* and 40*f* similarly provide the second current measurement signal to the measurement IC 44 through the current input circuit 314. The current input circuit 314 preferably converts the second current measurement signal to a voltage signal having a magnitude and phase that is representative of the Second line current. The socket 40*d* provides the second voltage measurement signal through the voltage input circuit 318 to the measurement IC 44. The socket 40*d* further provides the Second line voltage to the power supply 49. The power supply 49 is further connected to the neutral plug 40*g* and operates to provide a supply voltage Vcc to each of the functional block circuits within the measurement module 14.

The measurement IC 44 receives the voltage and current measurement signal, and generates energy consumption data therefrom. To this end, the measurement IC 44 preferably samples, multiplies and accumulates the measurement signals as is known in the art to generate watt data, VA data, and/or VAR data. See, for example, U.S. Pat. No. 6,112,158 or U.S. Pat. No. 6,112,159, as discussed above, for a description of such operations. The measurement IC 44 further applies a compensation to the measurement signals in accordance with the calibration data received from the memory 23. For example, the current measurement signals may be digitized and then multiplied by a scalar derived from the calibration data received from the memory 23 in order to compensate for the magnitude error on the corresponding current sensor. Similarly, a delay may be introduced into the digitize voltage measurement signal to compensate for phase error on the corresponding sensor, where the length of the delay is based on the phase error data received from the memory 23. It will be appreciated that other methods of applying phase error and magnitude error compensation may be employed. Such methods may occur in the measurement IC 44 or similar device, or in the processor 48 or another processing circuit. Nevertheless, any of such compensations will employ the phase error and magnitude error data specific to the sensors stored in the memory 23.

The processor 48 then obtains watt data, VA data, and/or VAR data and further processes the data to provide energy consumption information in standard units in accordance with metering industry standards. The energy consumption information is communication externally through the display 38. Alternatively or additionally, the energy consumption information may be communication through an external communication circuit, not shown.

In certain alternative embodiments, the sensor error information may be communicated to the measurement module 14 of FIG. 1 in other ways. For example, the sensor error may provided as indicia on a label on the exterior of the housing of the sensor, for example, on the top plate 28 of the sensor 12 of FIG. 2. In such a case, a technician may read the sensor error-related information on the label and enter corresponding information into a portable computing device, not shown. Alternatively, the sensor error information may be in the form bar code on the label that may be read with a portable computing device having a scanner, not shown. The technician may then communicate the sensor error information, or other calibration information generated from the sensor error information to the measurement module 14 using known means. Thus, any time the measurement module 14 is replaced, the technician may obtain the sensor error information from the label indicia and communicated to the new measurement module 14.

In addition, the sensor error information in any of the above embodiments may furthermore comprise a unique sensor module code, similar to a serial number, instead of actual error data or calibration coefficient data. A master table of sensor module serial codes may then be maintained. Each sensor module code in the master table is associated with the particular sensor error data for the corresponding sensor. In one implementation, the master table may suitably be maintained in the memory 50 of each measurement module 14, and the unique sensor module code may be stored in the calibration memory 23. In such a case, the processor 48 of FIG. 5 would obtain the unique sensor module code from the memory 23 of the sensor module 12 and perform a table look up in the memory 50 to obtain the sensor error and/or calibration data associated with that sensor module code. In other implementations, the sensor module code may be represented on indicia on a label on the sensor 12, and the look up table may be stored in a portable computing device.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An electricity meter comprising:
   a sensor module for connecting to the electrical system of a facility, said sensor module having voltage and current sensors and a memory device, said voltage and current sensors operative to receive voltage and current signals from the electrical system and generate measurement signals therefrom, said memory device storing sensor calibration data; and a measurement module including a measurement circuit operative to receive the measurement signals from said sensor module and the sensor calibration data from said memory device and generate energy consumption data therefrom.

2. The electricity meter of claim 1, wherein said sensor calibration data comprises phase error data.

3. The electricity meter of claim 2, wherein said phase error data includes coefficients of a polynomial, the polynomial representing a calibration relationship for the sensor module.

4. The electricity meter of claim 2, wherein said measurement circuit is operative to introduce a time delay to generate energy consumption data, the time delay based on said phase error data.

5. The electricity meter of claim 1, wherein said sensor calibration data comprises magnitude error data.

6. The electricity meter of claim 5, wherein said magnitude error data includes coefficients of a polynomial, the polynomial representing a calibration relationship for the sensor module.

7. The electricity meter of claim 5, wherein said measurement circuit is operative to introduce a magnitude adjustment to generate energy consumption data, the magnitude adjustment based on said magnitude error data.

8. An electricity meter comprising:
a sensor module for connecting to the electrical system of a facility, said sensor module having voltage and current sensors, and a memory device, said voltage and current sensors operative to receive voltage and current signals from the electrical system and generate measurement signals therefrom, said memory device storing voltage sensor calibration data and current sensor calibration data; and
a measurement module including a measurement circuit operative to receive the measurement signals from said sensor module, the voltage sensor calibration data, and the current sensor calibration data from said memory device and generate energy consumption data therefrom.

9. The electricity meter of claim 8, wherein at least one of said voltage sensor calibration data and said current sensor calibration data comprises phase error data.

10. The electricity meter of claim 9, wherein said phase error data includes coefficients of a polynomial, the polynomial representing a calibration relationship for the sensor module.

11. The electricity meter of claim 9, wherein said measurement circuit is operative to introduce a time delay to generate energy consumption data, the time delay based on said phase error data.

12. The electricity meter of claim 8, wherein said sensor calibration data comprises magnitude error data.

13. The electricity meter of claim 12, wherein said magnitude error data includes coefficients of a polynomial.

14. The electricity meter of claim 12, wherein said measurement circuit is operative to introduce a magnitude adjustment to generate energy consumption data, the magnitude adjustment based on said magnitude error data.

15. A method of generating energy measurement signals in an electricity meter connectable to an electrical system of a facility, the electricity meter having a sensor module with a voltage sensor and a current sensor, and a measurement module with measurement circuitry, said method comprising:
a) obtaining sensor calibration data for at least one of the current sensor and the voltage sensor from the sensor module and providing the sensor calibration data to the sensor measurement module;
b) obtaining by the sensor module energy measurement signals of the electrical system;
c) providing the energy measurement signals and the sensor calibration data to the measurement module; and
d) generating in the measurement module energy consumption data from the energy measurement signals and the sensor calibration data.

16. The method of claim 15, wherein the step of obtaining sensor calibration data includes obtaining current sensor calibration data.

17. The method of claim 15, wherein the step of obtaining sensor calibration data includes obtaining voltage sensor calibration data.

18. The method of claim 15, wherein the step of obtaining sensor calibration data includes obtaining data from indicia on a label disposed on the sensor module.

19. The method of claim 15, wherein the step of obtaining sensor calibration data includes obtaining data from a memory within the sensor module.

20. The method of claim 15, wherein the step of obtaining sensor calibration data includes obtaining a unique identifier associated with the sensor module and associating the unique identifier with one of a stored plurality of sets of sensor calibration data.

* * * * *